(12) United States Patent
Lai et al.

(10) Patent No.: US 9,761,555 B2
(45) Date of Patent: Sep. 12, 2017

(54) PASSIVE COMPONENT STRUCTURE AND MANUFACTURING METHOD THEREOF

(71) Applicant: XINTEC INC., Taoyuan (TW)

(72) Inventors: Jiun-Yen Lai, Taipei (TW); Yu-Wen Hu, Taoyuan (TW); Bai-Yao Lou, Taipei (TW); Chia-Sheng Lin, Taoyuan (TW); Yen-Shih Ho, Kaohsiung (TW); Hsin Kuan, Zhubei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/604,525

(22) Filed: Jan. 23, 2015

(65) Prior Publication Data

US 2015/0214162 A1    Jul. 30, 2015

Related U.S. Application Data

(60) Provisional application No. 61/931,410, filed on Jan. 24, 2014.

(51) Int. Cl.
*H01L 31/00* (2006.01)
*H01L 23/00* (2006.01)
(Continued)

(52) U.S. Cl.
CPC .......... *H01L 24/81* (2013.01); *H01L 23/5227* (2013.01); *H01L 24/03* (2013.01);
(Continued)

(58) Field of Classification Search
CPC .. H01L 23/5227–23/5228; H01L 23/66; H01L 24/05; H01L 24/13; H01L 23/525;
(Continued)

(56) References Cited

U.S. PATENT DOCUMENTS

2003/0127747 A1* 7/2003 Kajiwara ................ H01L 24/02
                                                       257/778
2004/0029404 A1    2/2004 Lin
(Continued)

FOREIGN PATENT DOCUMENTS

CN        1190258       8/1998
CN      101232782       7/2008
(Continued)

*Primary Examiner* — Cuong B Nguyen
(74) *Attorney, Agent, or Firm* — Liu & Liu

(57) ABSTRACT

A manufacturing method of a passive component structure includes the following steps. A protection layer is formed on a substrate, and bond pads of the substrate are respectively exposed through protection layer openings. A conductive layer is formed on the bond pads and the protection layer. A patterned photoresist layer is formed on the conductive layer, and the conductive layer adjacent to the protection layer openings is exposed through photoresist layer openings. Copper bumps are respectively electroplated on the conductive layer. The photoresist layer and the conductive layer not covered by the copper bumps are removed. A passivation layer is formed on the copper bumps and the protection layer, and at least one of the copper bumps is exposed through a passivation layer opening. A diffusion barrier layer and an oxidation barrier layer are chemically plated in sequence on the copper bump.

19 Claims, 10 Drawing Sheets

(51) Int. Cl.
*H01L 23/522* (2006.01)
*H01L 49/02* (2006.01)

(52) U.S. Cl.
CPC .............. *H01L 24/05* (2013.01); *H01L 24/13* (2013.01); *H01L 24/48* (2013.01); *H01L 28/10* (2013.01); *H01L 2224/0347* (2013.01); *H01L 2224/0391* (2013.01); *H01L 2224/03462* (2013.01); *H01L 2224/03902* (2013.01); *H01L 2224/0401* (2013.01); *H01L 2224/04042* (2013.01); *H01L 2224/05005* (2013.01); *H01L 2224/05007* (2013.01); *H01L 2224/05022* (2013.01); *H01L 2224/05026* (2013.01); *H01L 2224/05027* (2013.01); *H01L 2224/05147* (2013.01); *H01L 2224/05155* (2013.01); *H01L 2224/05164* (2013.01); *H01L 2224/05562* (2013.01); *H01L 2224/05564* (2013.01); *H01L 2224/05571* (2013.01); *H01L 2224/05583* (2013.01); *H01L 2224/05644* (2013.01); *H01L 2224/131* (2013.01); *H01L 2224/1308* (2013.01); *H01L 2224/13021* (2013.01); *H01L 2224/13147* (2013.01); *H01L 2224/13155* (2013.01); *H01L 2224/13164* (2013.01); *H01L 2224/13562* (2013.01); *H01L 2224/13644* (2013.01); *H01L 2224/48* (2013.01); *H01L 2924/00014* (2013.01)

(58) Field of Classification Search
CPC ......... H01L 2924/1206; H01L 2924/12; H01L 2224/0345; H01L 2224/03462; H01L 2224/05027; H01L 2224/05147; H01L 2924/01075; H01L 2224/05082; H01L 2224/13
See application file for complete search history.

(56) References Cited

U.S. PATENT DOCUMENTS

| | | | |
|---|---|---|---|
| 2004/0121606 A1 | 6/2004 | Raskin et al. | |
| 2010/0078778 A1* | 4/2010 | Barth et al. | 257/659 |
| 2010/0244263 A1* | 9/2010 | Lin et al. | 257/758 |
| 2010/0246152 A1* | 9/2010 | Lin | G06F 1/16 |
| | | | 361/783 |
| 2012/0126368 A1* | 5/2012 | Chan | H01L 23/5227 |
| | | | 257/531 |
| 2013/0168132 A1 | 7/2013 | Lee et al. | |
| 2013/0320522 A1* | 12/2013 | Lai et al. | 257/737 |

FOREIGN PATENT DOCUMENTS

| | | |
|---|---|---|
| CN | 101267713 | 9/2008 |
| CN | 102263067 | 11/2011 |
| CN | 102347284 | 2/2012 |
| CN | 102810522 | 12/2012 |
| TW | 200516682 | 5/2005 |
| TW | 201044523 | 12/2010 |
| TW | 201133652 | 10/2011 |
| TW | 201133733 | 10/2011 |
| TW | 201320209 | 5/2013 |
| TW | 201401455 | 1/2014 |
| TW | 201515031 | 4/2015 |

* cited by examiner

PASSIVE COMPONENT STRUCTURE AND MANUFACTURING METHOD THEREOF

RELATED APPLICATIONS

This application claims priority to U.S. provisional Application Ser. No. 61/931,410, filed Jan. 24, 2014, which is herein incorporated by reference.

BACKGROUND

Field of Invention

The present invention relates to a passive component structure and a manufacturing method of the passive component structure.

Description of Related Art

A conventional inductor structure may include a silicon substrate and plural copper bumps. The silicon substrate has plural bond pads. The copper bumps that can transmit high frequency signals are respectively formed on the bond pads by electroplating. In the subsequent manufacturing process, ball grid array (BGA) or conductive protrusions may be electrically connected to the bond pads of the silicon substrate through the copper bumps. Tin and lead cannot directly adhered to the copper bump. Hence, after the copper bump is electroplated completely, a nickel layer and a gold layer need to be electroplated on the copper bump in sequence. The nickel layer has a high resistance property to prevent the gold layer and the copper bump from melting with each other in a high temperature environment, and the gold layer may prevent the copper bump from oxidation.

A solder ball or a conductive protrusion may be adhered to the copper bump through the nickel layer and the gold layer. However, only few copper bumps of an inductor structure need to be electrically connected to the conductive protrusions or the solder balls in the following manufacturing process, such as a BGA process or a wire bonding process. Most of the copper bumps in fact do not need to be electrically connected to the solder balls or the conductive protrusions. In general, when the inductor structure is manufactured, all of the copper bumps are going to be electroplated with the nickel layers and the gold layers due to the limited process capability.

As a result, electroplating materials (e.g., gold) may be wasted. Further, the nickel layers and the gold layers that are electroplated on all of the copper bumps may increase the total resistance of the circuits of the inductor structure, which reduces the efficiency of the inductor structure. As such, it is difficult to improve the inductance quality factor of the inductor structure.

SUMMARY

An aspect of the present invention is to provide a passive component structure.

According to an embodiment of the present invention, a passive component structure includes a substrate, a protection layer, a patterned conductive layer, a plurality of copper bumps, a diffusion barrier layer, and an oxidation barrier layer. The substrate has a plurality of bond pads. The protection layer is formed on the substrate and the bond pads. The protection layer has a plurality of protection layer openings, and the positions of the protection layer openings respectively correspond to the positions of the bond pads. The conductive layer is located on the bond pads and surfaces of the protection layer adjacent to the protection layer openings. The copper bumps are located on the conductive layer. The diffusion barrier layer is located on at least one of the copper bumps. The oxidation barrier layer covers the diffusion barrier layer.

In one embodiment of the present invention, the passive component structure further includes a passivation layer. The passivation layer is located on the protection layer and the copper bumps and has a passivation layer opening. The position of the passivation layer opening corresponds to the position of the oxidation barrier layer.

In one embodiment of the present invention, the passive component structure further includes a strengthening layer. The strengthening layer is between the diffusion barrier layer and the oxidation barrier layer.

In one embodiment of the present invention, the strengthening layer is made of a material including palladium.

In one embodiment of the present invention, the diffusion barrier layer is made of a material including nickel.

In one embodiment of the present invention, the oxidation barrier layer is made of a material including gold.

In one embodiment of the present invention, the thickness of the oxidation barrier layer is in a range from 0.01 µm to 0.1 µm.

In one embodiment of the present invention, the passive component structure further includes a conductive structure. The conductive structure is electrically connected to the oxidation barrier layer.

In one embodiment of the present invention, the conductive structure includes a solder ball or conductive wire.

Another aspect of the present invention is to provide a manufacturing method of a passive component structure.

According to an embodiment of the present invention, a manufacturing method of a passive component structure includes the following steps. (a) A substrate having a plurality of bond pads is provided. (b) A protection layer is formed on the substrate, and the bond pads are respectively exposed through a plurality of protection layer openings of the protection layer. (c) A conductive layer is formed on the bond pads and the protection layer. (d) A patterned photoresist layer is formed on the conductive layer, and the conductive layer adjacent to the protection layer openings is exposed through a plurality of photoresist layer openings of the photoresist layer. (e) A plurality of copper bumps are respectively electroplated on the conductive layer that is located in the photoresist layer openings. (f) The photoresist layer and the conductive layer that is not covered by the copper bumps are removed. (g) A passivation layer is formed on the copper bumps and the protection layer, and at least one of the copper bumps is exposed through a passivation layer opening of the passivation layer. (h) A diffusion barrier layer and an oxidation barrier layer are chemically plated in sequence on the copper bump that is exposed through the passivation layer opening.

In one embodiment of the present invention, in step (h), a strengthening layer is chemically plated on the diffusion barrier layer.

In one embodiment of the present invention, in step (f), the conductive layer that is not covered by the copper bumps is etched.

In one embodiment of the present invention, the passivation layer is made of a material including a solder mask.

In one embodiment of the present invention, the passivation layer is made of a material including photoresist, and the manufacturing method of the passive component structure further includes the following step. The passivation layer is removed.

In one embodiment of the present invention, in step (b), the protection layer is patterned, such that the protection layer has the protection layer openings.

In the aforementioned embodiments of the present invention, the passive component structure and the manufacturing method thereof may form the diffusion barrier layer and the oxidation barrier layer on the selected copper bump, such that the diffusion barrier layer and the oxidation barrier layer are only formed on the copper bump that needs to be electrically connected to a solder ball or a conductive wire in the next manufacturing process (e.g., a BGA process or a wire bonding process), and the diffusion barrier layer and the oxidation barrier layer are not formed on other copper bumps. In addition, the oxidation barrier layer is formed on the copper bump by chemical plating, so that the thickness of the oxidation barrier layer may be smaller than the thickness of a conventional oxidation barrier layer that is formed by electroplating. As a result, the passive component structure and the manufacturing method of the present invention not only may reduce the material costs of the diffusion barrier layer and the oxidation barrier layer, but also may reduce the entire resistance of the circuits of the passive component structure to improve the efficiency of the passive component structure, such that the inductance quality factor of the passive component structure may be improved.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
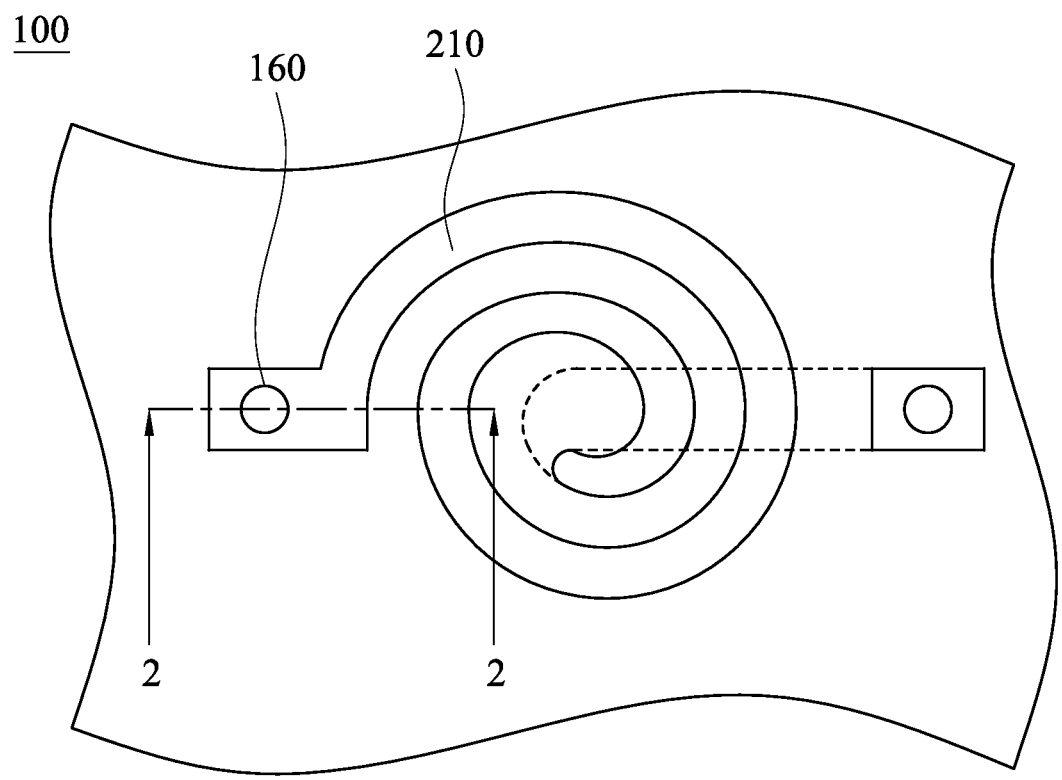
FIG. 1 is a top view of a passive component structure according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
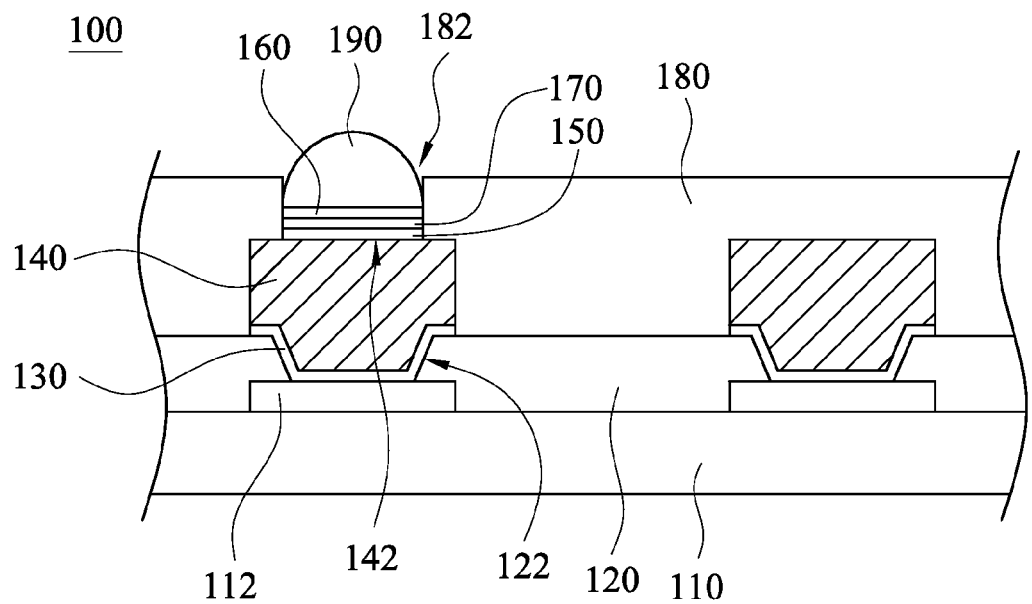
FIG. 2 is a cross-sectional view of the passive component structure taken along line 2-2 shown in FIG. 1.

FIG. 1 is a top view of a passive component structure 100 according to one embodiment of the present invention. FIG. 2 is a cross-sectional view of the passive component structure 100 taken along line 2-2 shown in FIG. 1. In order to simplify the following description, a circuit layer 210 shown in FIG. 1 will not be shown in all cross-sectional views herein. As shown in FIG. 1 and FIG. 2, the passive component structure 100 includes a substrate 110, a protection layer 120, a patterned conductive layer 130, a plurality of copper bumps 140, a diffusion barrier layer 150, and an oxidation barrier layer 160. The passive component structure 100 may be used in inductors, capacitances, or other passive components. The surface of the substrate 110 has a plurality of bond pads 112. The protection layer 120 is located on the substrate 110 and the bond pads 112. The protection layer 120 has a plurality of protection layer openings 122, and the positions of the protection layer openings 122 respectively correspond to the positions of the bond pads 112. The conductive layer 130 is located on the bond pads 112 and the surfaces of the protection layer 120 adjacent to the protection layer openings 122. The copper bumps 140 are located on the conductive layer 130. The diffusion barrier layer 150 is located on at least one of the copper bumps 140. In this embodiment, the diffusion barrier layer 150 is located on the top surface 142 of the copper bump 140. The oxidation barrier layer 160 covers the diffusion barrier layer 150.

Moreover, the passive component structure 100 may further include a strengthening layer 170, a passivation layer 180, and a conductive structure 190. The strengthening layer 170 is between the diffusion barrier layer 150 and the oxidation barrier layer 160. The passivation layer 180 is located on the protection layer 120 and the copper bumps 140. The passivation layer 180 has a passivation layer opening 182. The position of the passivation layer opening 182 corresponds to the position of the oxidation barrier layer 160. In this embodiment, the width of the passivation layer opening 182 is smaller than the width of the copper bump 140. The conductive structure 190 is electrically connected to the oxidation barrier layer 160. The diffusion barrier layer 150, the strengthening layer 170, and the oxidation barrier layer 160 are formed on the copper bump 140 in sequence by chemical plating (also referred to as electroless plating or autocatalytic plating). The thickness of the oxidation barrier layer 160 that is formed by chemical plating is thin, and may be in a range from 0.01 μm to 0.1 μm. The strengthening layer 170 may provide supporting strength for the oxidation barrier layer 160 so as to prevent the oxidation barrier layer 160 from being damaged during a BGA process or a wire bonding process.

In this embodiment, the substrate 110 may be made of a material including silicon, and the bond pad 112 may be made of a material including aluminum. The protection layer 120 may be made of a material including polymer, oxide (e.g., $SiO_2$), or nitride. The conductive layer 130 may be made of a material including titanium and copper. The diffusion barrier layer 150 may be made of a material including nickel, such that the diffusion barrier layer 150 has a high resistance property to prevent the oxidation barrier layer 160 and the copper bump 140 from melting with each other in a high temperature environment. The oxidation barrier layer 160 may be made of a material including gold, such that the oxidation barrier layer 160 may prevent the copper bump 140 from oxidation. The strengthening layer 170 may be made of a material including palladium, such that the strengthening layer 170 may provide supporting strength for the oxidation barrier layer 160. The passivation layer 180 may be made of a material including a solder mask, such that the passivation layer 180 may prevent moisture and dust entering the passive component structure 100, thereby preventing the oxidation of the copper bump 140. The conductive structure 190 may be a solder ball. However, the present invention is not limited to the aforesaid materials.

When the passive component structure 100 is in a BGA process or a wire bonding process, the conductive structure 190 may be electrically connected to the oxidation barrier layer 160, such that the conductive structure 190 may be electrically connected to the conductive layer 130 and the bond pad 112 through the copper bump 140 with the diffusion barrier layer 150, the strengthening layer 170, and the oxidation barrier layer 160 (e.g., the copper bump at the left side of FIG. 2). The copper bump 140 without the diffusion barrier layer 150, the strengthening layer 170, and the oxidation barrier layer 160 (e.g., the copper bump at the right side of FIG. 2) is covered by the passivation layer 180 and not used to be electrically connected to the conductive structure 190. As a result, the passive component structure 100 may reduce the material costs of the diffusion barrier layer 150, the strengthening layer 170, and the oxidation barrier layer 160, and may reduce the entire resistance of the circuits of the passive component structure 100 to improve the efficiency of the passive component structure 100, such that the inductance quality factor of the passive component structure 100 may be improved.

It is to be noted that the connection relationships and the materials of the elements described above will not be repeated in the following description.

Figure 3:
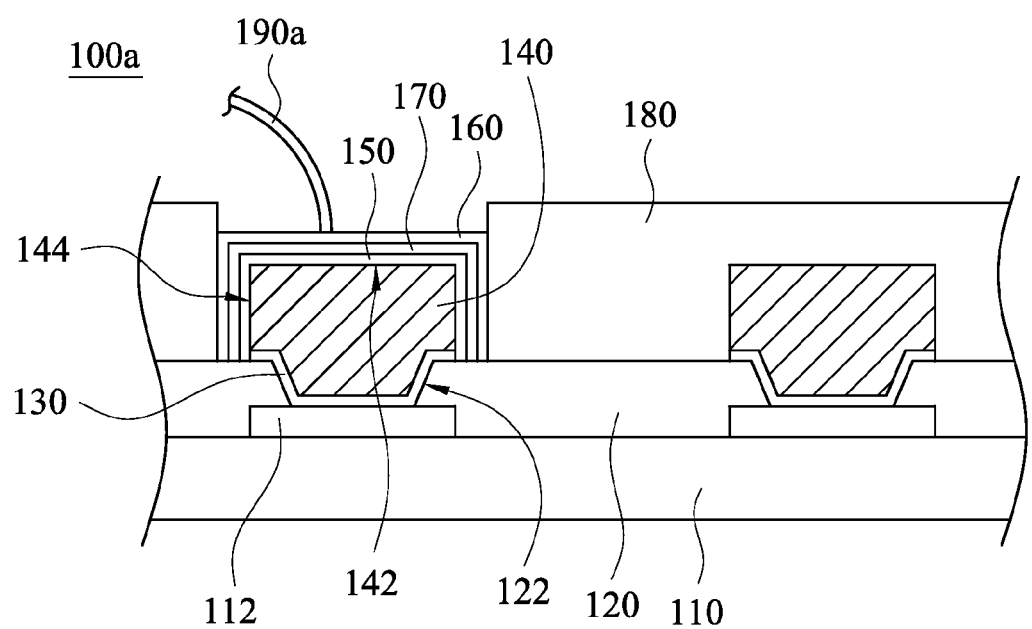
FIG. 3 is a cross-sectional view of a passive component structure according to one embodiment of the present invention, in which the position of the cut line is the same that of FIG. 2.

FIG. 3 is a cross-sectional view of a passive component structure 100a according to one embodiment of the present invention, in which the position of the cut line is the same that of FIG. 2. The passive component structure 100a includes the substrate 110, the protection layer 120, the patterned conductive layer 130, the copper bumps 140, the diffusion barrier layer 150, and the oxidation barrier layer 160. The different between this embodiment and the embodiment shown in FIG. 2 is that the width of the passivation layer opening 182 is greater than the width of the copper bump 140. The diffusion barrier layer 150 is located on top surface 142 and the side surface 144 of the copper bump 140. A conductive structure 190a is a conductive wire. The passive component structure 100a may reduce the material costs, and may reduce the entire resistance of the circuits of the passive component structure 100a to improve the efficiency of the passive component structure 100a, such that the inductance quality factor of the passive component structure 100a may be improved.

Figure 4:
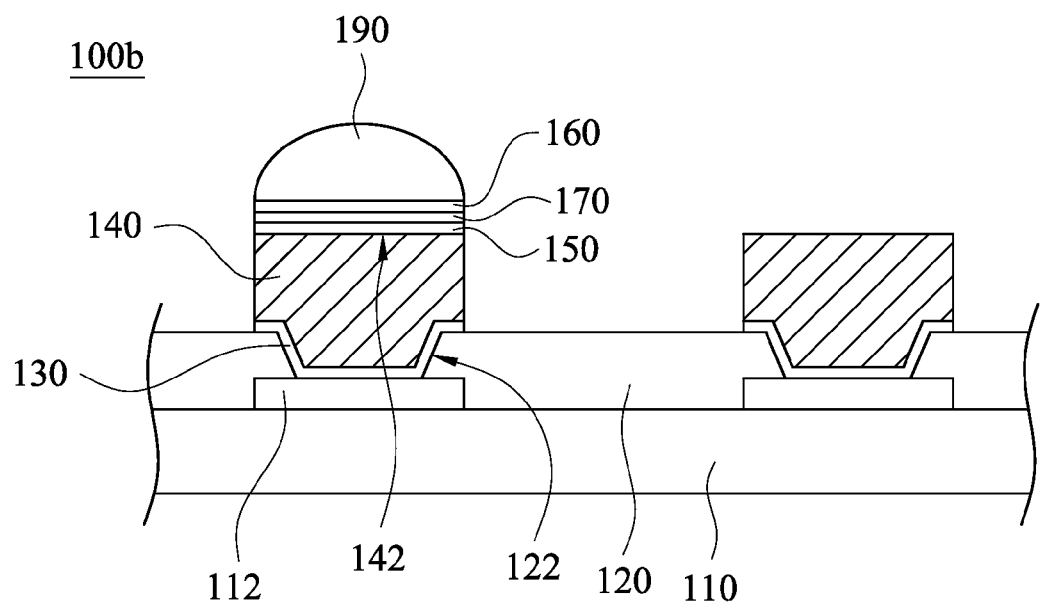
FIG. 4 is a cross-sectional view of a passive component structure according to one embodiment of the present invention, in which the position of the cut line is the same that of FIG. 2.

FIG. 4 is a cross-sectional view of a passive component structure 100b according to one embodiment of the present invention, in which the position of the cut line is the same that of FIG. 2. The passive component structure 100b includes the substrate 110, the protection layer 120, the patterned conductive layer 130, the copper bumps 140, the diffusion barrier layer 150, and the oxidation barrier layer 160. The different between this embodiment and the embodiment shown in FIG. 2 is that the passive component structure 100b does not have the passivation layer 180. The passive component structure 100b may reduce the material costs, and may reduce the entire resistance of the circuits of the passive component structure 100b to improve the efficiency of the passive component structure 100b, such that the inductance quality factor of the passive component structure 100b may be improved.

Figure 5:
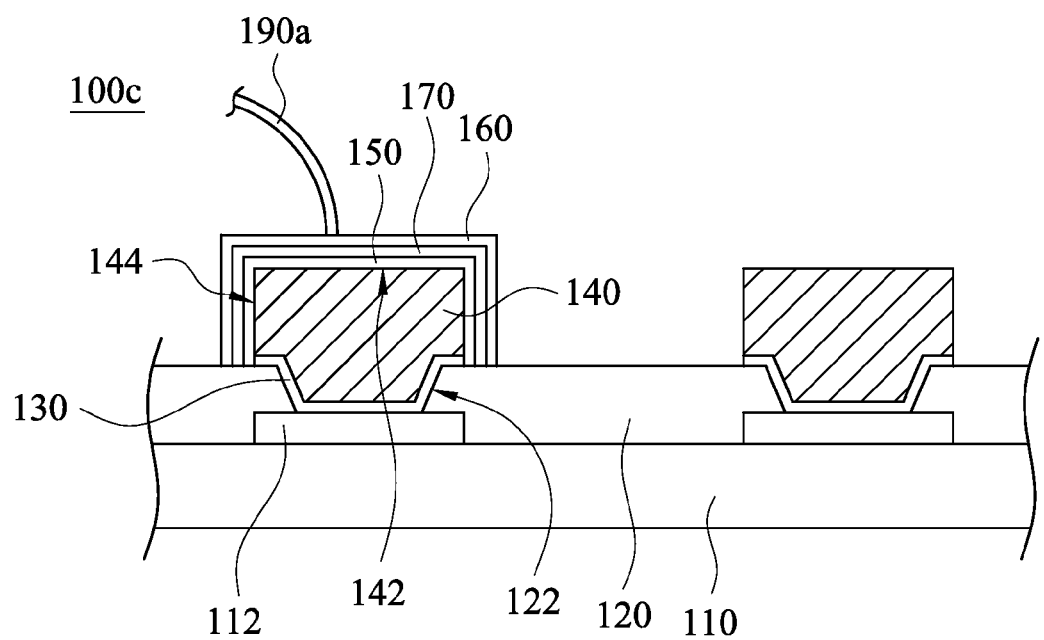
FIG. 5 is a cross-sectional view of a passive component structure according to one embodiment of the present invention, in which the position of the cut line is the same that of FIG. 3.

FIG. 5 is a cross-sectional view of a passive component structure 100c according to one embodiment of the present invention, in which the position of the cut line is the same that of FIG. 3. The passive component structure 100c includes the substrate 110, the protection layer 120, the patterned conductive layer 130, the copper bumps 140, the diffusion barrier layer 150, and the oxidation barrier layer 160. The different between this embodiment and the embodiment shown in FIG. 3 is that the passive component structure 100c does not have the passivation layer 180. The passive component structure 100c may reduce the material costs, and may reduce the entire resistance of the circuits of the passive component structure 100c to improve the efficiency of the passive component structure 100c, such that the inductance quality factor of the passive component structure 100c may be improved.

In the following description, the manufacturing methods of the semiconductor structures 100, 100a, 100b, 100c will be described.

Figure 6:
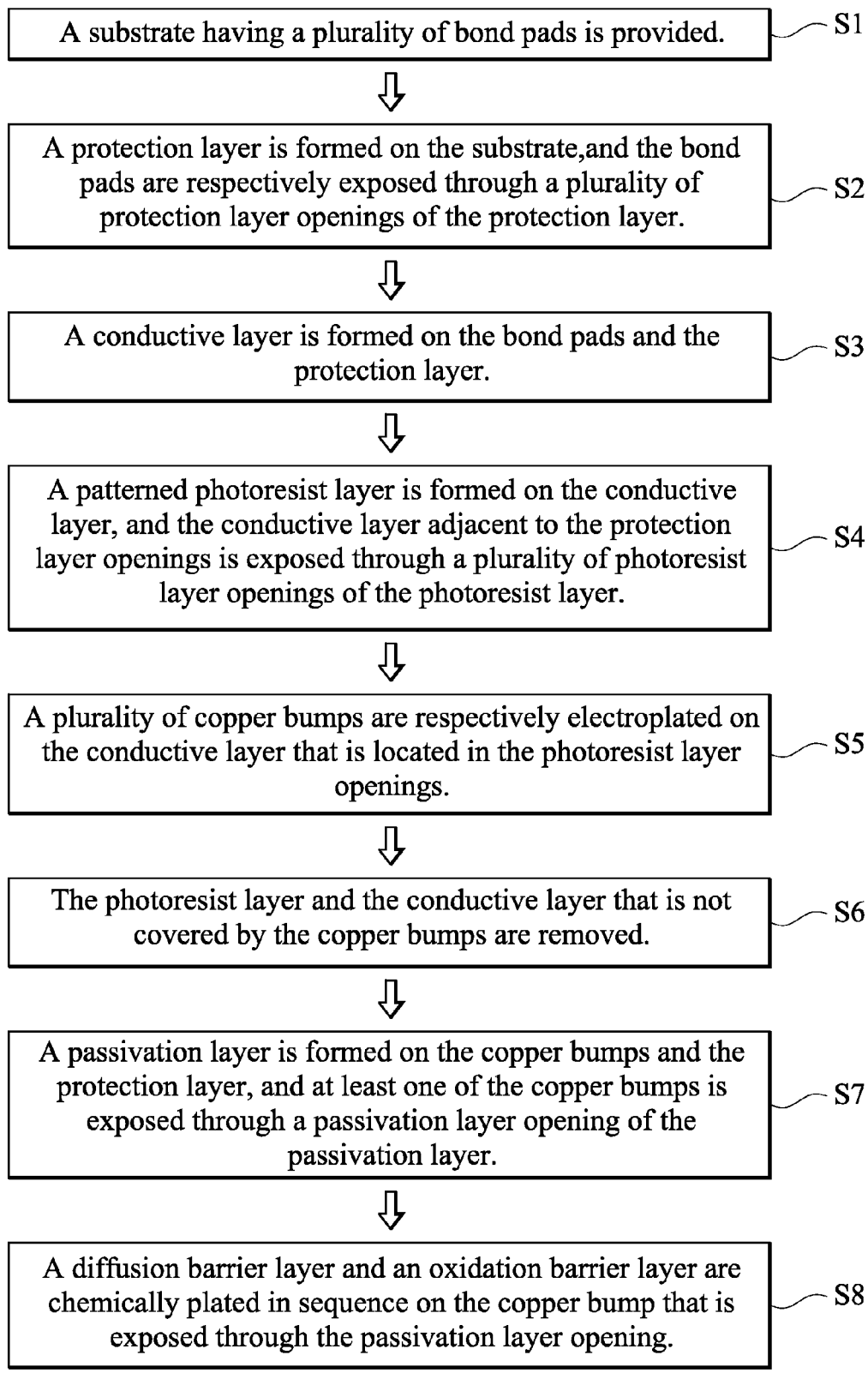
FIG. 6 is a flow chart of a manufacturing method of a passive component structure according to one embodiment of the present invention.

FIG. 6 is a flow chart of a manufacturing method of a passive component structure according to one embodiment of the present invention. In step S1, a substrate having a plurality of bond pads is provided. Thereafter in step S2, a protection layer is formed on the substrate, and the bond pads are respectively exposed through a plurality of protection layer openings of the protection layer. Next, in step S3, a conductive layer is formed on the bond pads and the protection layer. Then in step S4, a patterned photoresist layer is formed on the conductive layer, and the conductive layer adjacent to the protection layer openings is exposed through a plurality of photoresist layer openings of the photoresist layer. Thereafter in step S5, a plurality of copper bumps are respectively electroplated on the conductive layer that is located in the photoresist layer openings. Next in step S6, the photoresist layer and the conductive layer that is not covered by the copper bumps are removed. Thereafter in step S7, a passivation layer is formed on the copper bumps and the protection layer, and at least one of the copper bumps is exposed through a passivation layer opening of the passivation layer. Finally in step S8, a diffusion barrier layer and an oxidation barrier layer are chemically plated in sequence on the copper bump that is exposed through the passivation layer opening.

Figure 7:
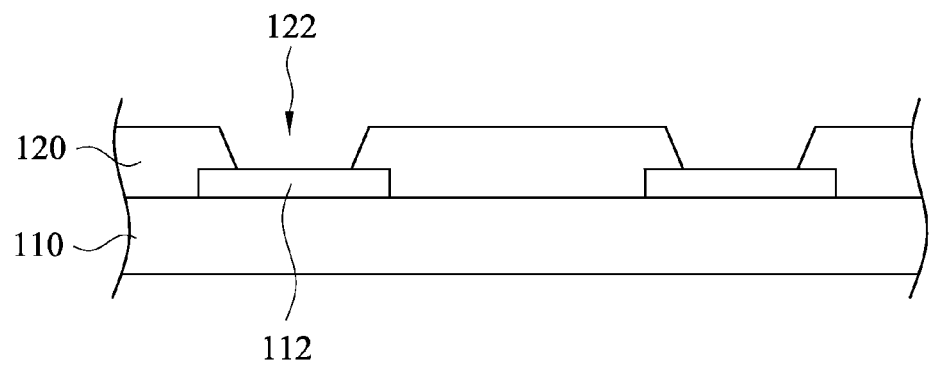
FIG. 7 is a cross-sectional view of bond pads after being respectively exposed through protection layer openings shown in FIG. 6.

FIG. 7 is a cross-sectional view of bond pads 112 after being respectively exposed through protection layer openings 122 shown in FIG. 6. First of all, a substrate 110 having the bond pads 112 is provided, and a protection layer 120 having the protection layer openings 112 is formed on the substrate 110 and the bond pads 112, such that the bond pads 112 are respectively exposed through the protection layer openings 122. A patterning process may be performed on the protection layer 120, such that the protection layer 120 has the protection layer openings 122 corresponding to the bond pads 112. The patterning process may include an exposure process, a development process, and an etching process.

Figure 8:
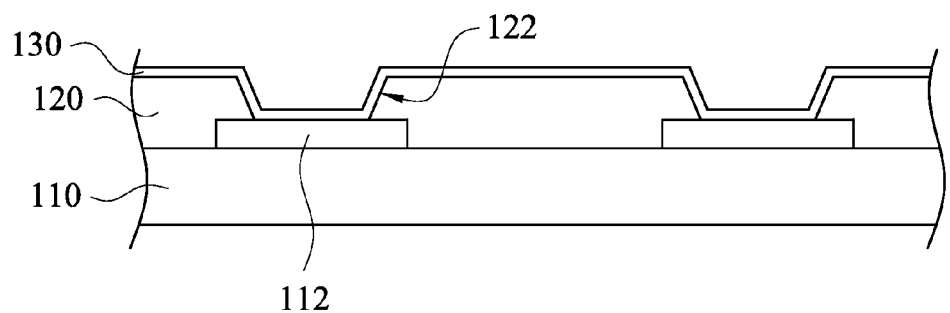
FIG. 8 is a cross-sectional view of a conductive layer after being formed on the bond pads and the protection layer shown in FIG. 7.

FIG. 8 is a cross-sectional view of a conductive layer 130 after being formed on the bond pads 112 and the protection layer 120 shown in FIG. 7. As shown in FIG. 7 and FIG. 8, after the bond pads 112 are respectively exposed through the protection layer openings 122, the conductive layer 130 may be formed on the bond pads 112 and the protection layer 120 by sputtering.

Figure 9:
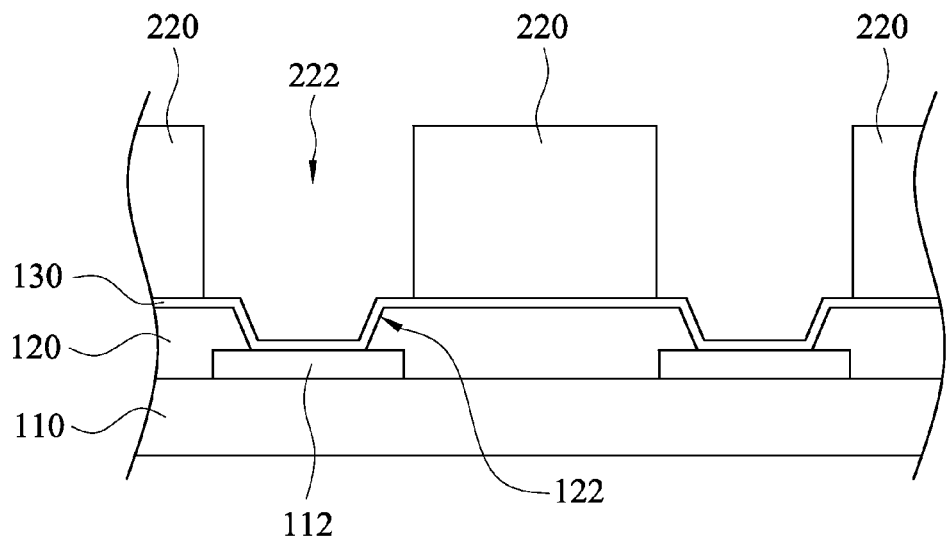
FIG. 9 is a cross-sectional view of a patterned photoresist layer after being formed on the conductive layer shown in FIG. 8.

FIG. 9 is a cross-sectional view of a patterned photoresist layer 220 after being formed on the conductive layer 130 shown in FIG. 8. As shown in FIG. 7 and FIG. 8, after the conductive layer 130 is formed on the bond pads 112 and the protection layer 120, the patterned photoresist layer 220 may be formed on the conductive layer 130, such that the conductive layer 130 adjacent to the protection layer openings 122 is exposed through a plurality of photoresist layer openings 222 of the photoresist layer 220.

Figure 10:
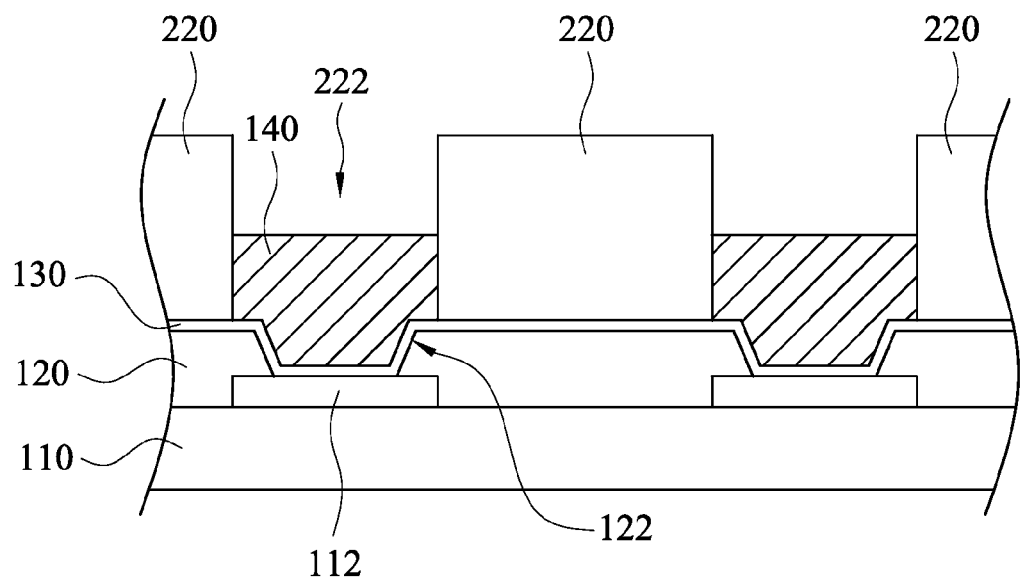
FIG. 10 is a cross-sectional view of copper bumps after being formed on the conductive layer that is located in photoresist layer openings shown in FIG. 9.

FIG. 10 is a cross-sectional view of copper bumps 140 after being formed on the conductive layer 130 that is located in the photoresist layer openings 222 shown in FIG. 9. As shown in FIG. 9 and FIG. 10, after the photoresist layer 220 is formed on the conductive layer 130, the copper bumps 140 may be respectively formed on the conductive layer 130 that is located in the photoresist layer openings 222. An electroplating process is used to form the copper bumps 140 on the conductive layer 130 in the photoresist layer openings 222.

Figure 11:
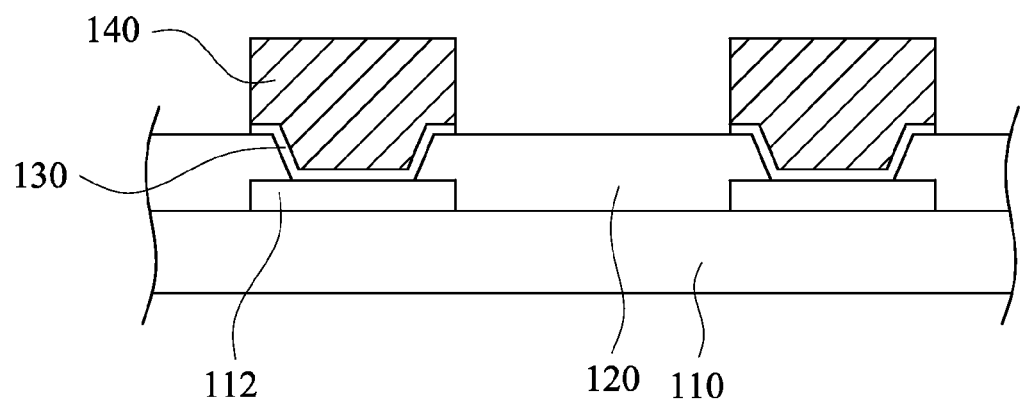
FIG. 11 is a cross-sectional view of the photoresist layer and the conductive layer that is not covered by the copper bumps shown in FIG. 10 after being removed.

FIG. 11 is a cross-sectional view of the photoresist layer 220 and the conductive layer 130 that is not covered by the copper bumps 140 shown in FIG. 10 after being removed. As shown in FIG. 10 and FIG. 11, after the copper bumps 140 are electroplated on the conductive layer 130, the photoresist layer 220 and the conductive layer 130 that is not covered by the copper bumps 140 may be removed. An etching process may be used to remove the conductive layer 130 that is not covered by the copper bumps 140.

Figure 12A:
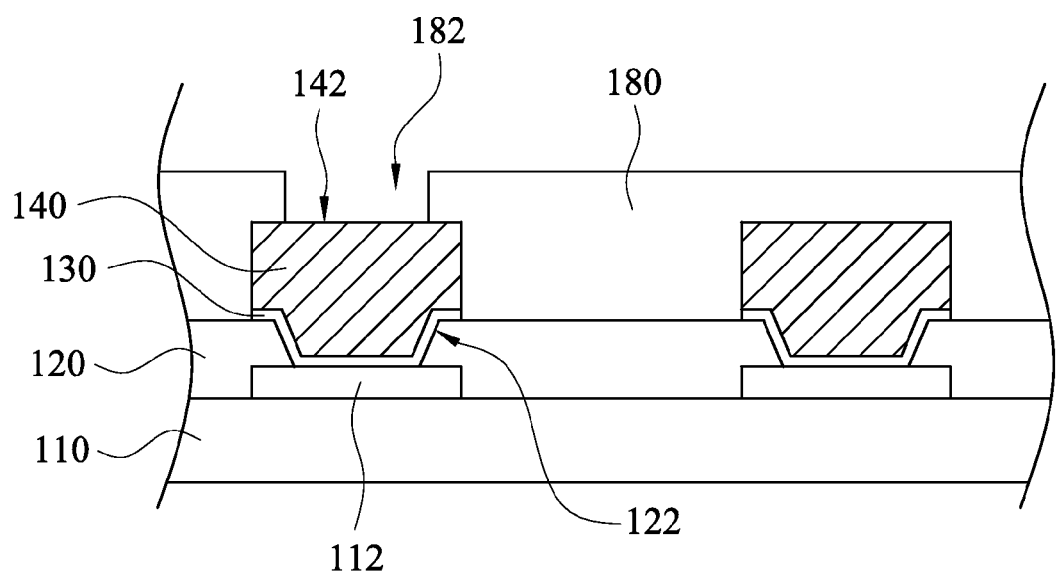
FIG. 12A is a cross-sectional view of a passivation layer after being formed on the copper bumps and the protection layer shown in FIG. 11.

FIG. 12A is a cross-sectional view of a passivation layer 180 after being formed on the copper bumps 140 and the protection layer 120 shown in FIG. 11. The passivation layer 180 has a passivation layer opening 182, such that at least one of the copper bumps 140 is exposed through the passivation layer opening 182. In this embodiment, the passivation layer 180 is made of a material including a solder mask.

As shown in FIG. 12A and FIG. 2, after the passivation layer 180 is formed on the copper bumps 140 and the protection layer 120, a diffusion barrier layer 150, a strengthening layer 170, and an oxidation barrier layer 160 may be chemically plated in sequence on the copper bump 140 that is exposed through the passivation layer opening 182. In this embodiment, since the width of the passivation layer opening 182 is smaller than the width of the copper bump 140, the diffusion barrier layer 150, the strengthening layer 170, and the oxidation barrier layer 160 may form on the top surface 142 of the copper bump 140. After the oxidation barrier layer 160 is formed, the oxidation barrier layer 160 may be electrically connected to a conductive structure 190, thereby obtaining the passive component structure 100 shown in FIG. 2.

Figure 12B:
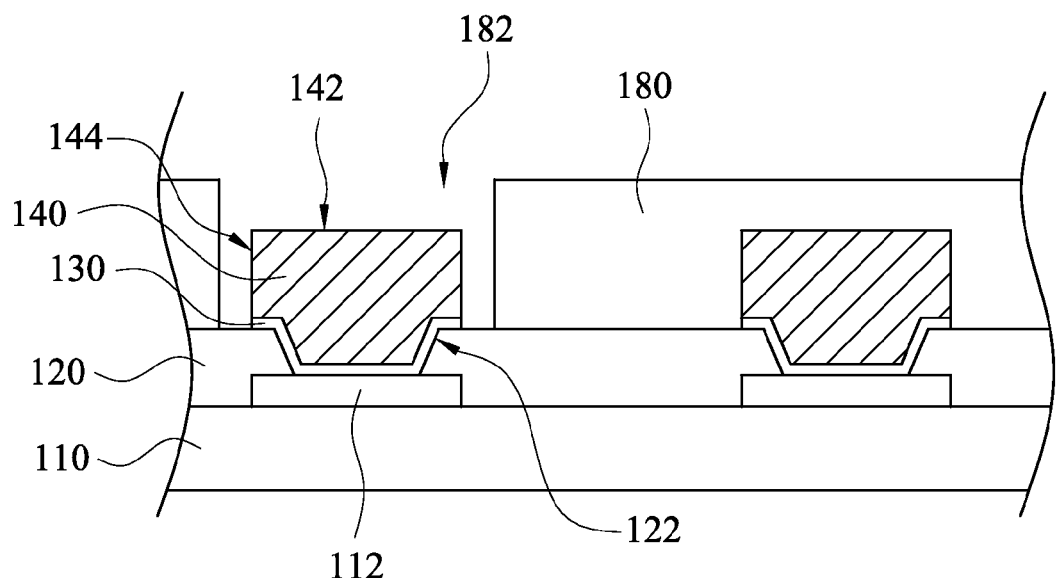
FIG. 12B is a cross-sectional view of another embodiment different from the embodiment shown in FIG. 12A.

FIG. 12B is a cross-sectional view of another embodiment different from the embodiment shown in FIG. 12A. As shown in FIG. 12B and FIG. 3, after the passivation layer 180 is formed on the copper bump 140 and the oxidation barrier layer 160, the diffusion barrier layer 150, the strengthening layer 170, and the oxidation barrier layer 160 may be chemically plated in sequence on the copper bump 140 that is exposed through the passivation layer opening 182. In this embodiment, since the width of the passivation layer opening 182 is greater than the width of the copper bump 140, the diffusion barrier layer 150, the strengthening layer 170, and the oxidation barrier layer 160 may be formed on the top surface 142 and the side surface 144 of the copper bump 140. After the oxidation barrier layer 160 is formed, a conductive structure 190a may be electrically connected to the oxidation barrier layer 160, thereby obtaining the passive component structure 100a shown in FIG. 3.

Figure 13A:
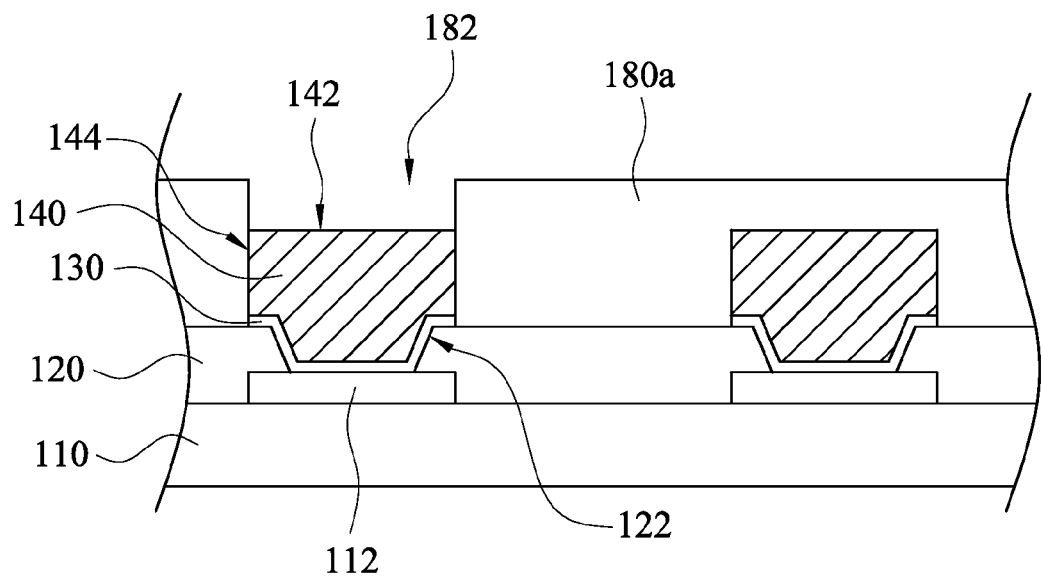
FIG. 13A is a cross-sectional view of a passivation layer after being formed on the copper bump and the protection layer shown in FIG. 11.
Figure 13B:
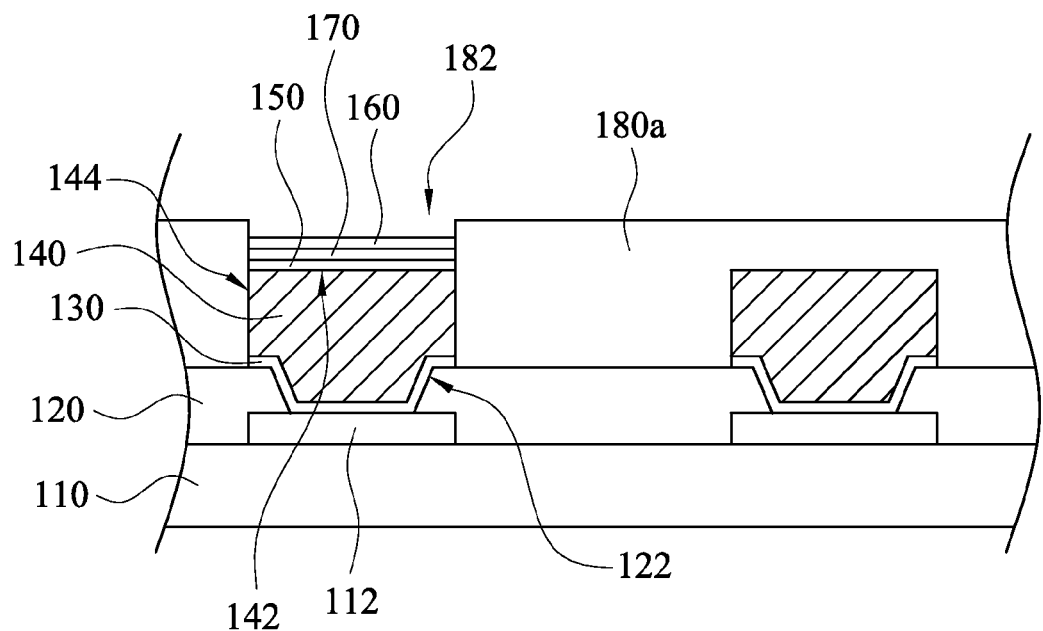
FIG. 13B is a cross-sectional view of a diffusion barrier layer, a strengthening layer, and an oxidation barrier layer after being formed on the copper bump shown in FIG. 13A.

FIG. 13A is a cross-sectional view of a passivation layer 180a after being formed on the copper bump 140 and the protection layer 120 shown in FIG. 11. FIG. 13B is a cross-sectional view of the diffusion barrier layer 150, the strengthening layer 170, and the oxidation barrier layer 160 after being formed on the copper bump 140 shown in FIG. 13A. As shown in FIG. 13A and FIG. 13B, in this embodiment, the passivation layer 180a is made of a material including photoresist. After the passivation layer 180a is formed on the copper bump 140 and the protection layer 120, the diffusion barrier layer 150, the strengthening layer 170, and the oxidation barrier layer 160 may be chemically plated in sequence on the copper bump 140 that is exposed through the passivation layer opening 182. In this embodiment, since the width of the passivation layer opening 182 is substantially equal to the width of the copper bump 140, the diffusion barrier layer 150, the strengthening layer 170, and the oxidation barrier layer 160 may be formed on the top surface 142 of the copper bump 140.

As shown in FIG. 13B and FIG. 4, after the oxidation barrier layer 160 is formed, the passivation layer 180a may be removed, and the conductive structure 190 is electrically connected to the oxidation barrier layer 160, thereby obtaining the passive component structure 100b shown in FIG. 4.

Figure 14A:
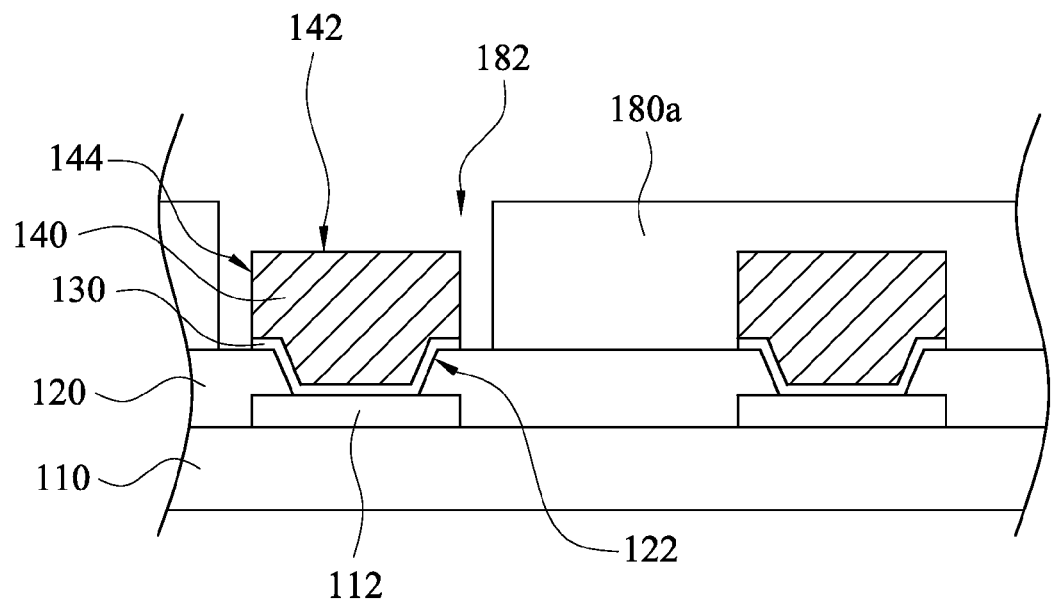
FIG. 14A is a cross-sectional view of another embodiment different from the embodiment shown in FIG. 13A.
Figure 14B:
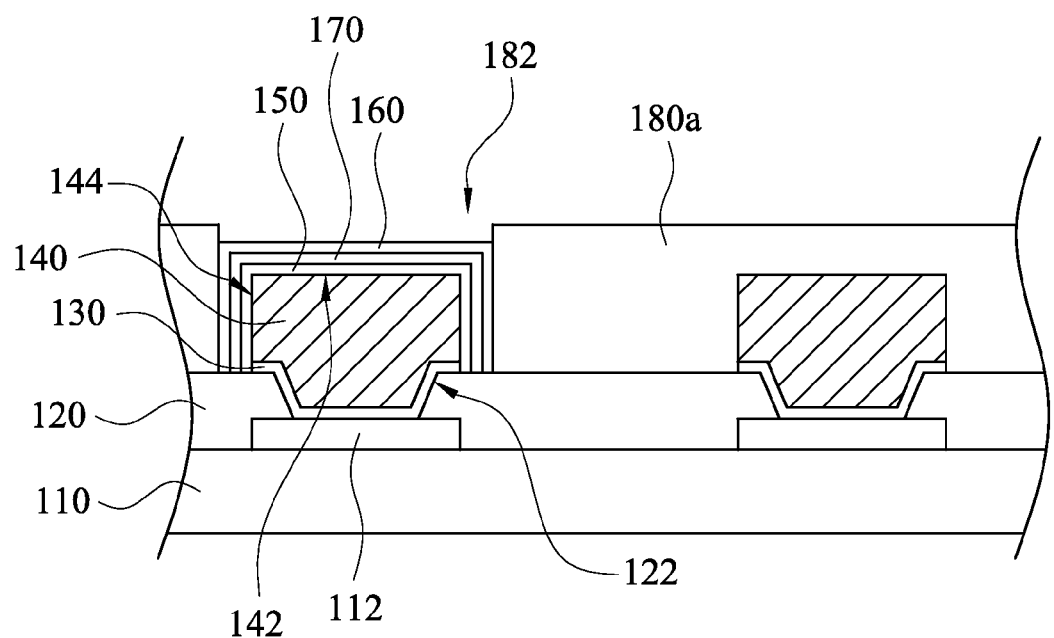
FIG. 14B is a cross-sectional view of the diffusion barrier layer, the strengthening layer, and the oxidation barrier layer after being formed on the copper bump shown in FIG. 14A.

FIG. 14A is a cross-sectional view of another embodiment different from the embodiment shown in FIG. 13A. FIG. 14B is a cross-sectional view of the diffusion barrier layer 150, the strengthening layer 170, and the oxidation barrier layer 160 after being formed on the copper bump 140 shown in FIG. 14A. As shown in FIG. 14A and FIG. 14B, in this embodiment, the passivation layer 180a is made of a material including photoresist. After the passivation layer 180a is formed on the copper bump 140 and the protection layer 120, the diffusion barrier layer 150, the strengthening layer 170, and the oxidation barrier layer 160 may be chemically plated in sequence on the copper bump 140 that is exposed through the passivation layer opening 182. In this embodiment, since the width of the passivation layer opening 182 is greater than the width of the copper bump 140, the diffusion barrier layer 150, the strengthening layer 170, and the oxidation barrier layer 160 may be formed on the top surface 142 and the side surface 144 of the copper bump 140.

As shown in FIG. 14B and FIG. 5, after the oxidation barrier layer 160 is formed, the passivation layer 180a may be removed, and the conductive structure 190a is electrically connected to the oxidation barrier layer 160, thereby obtaining the passive component structure 100c shown in FIG. 5.

Figure 15:
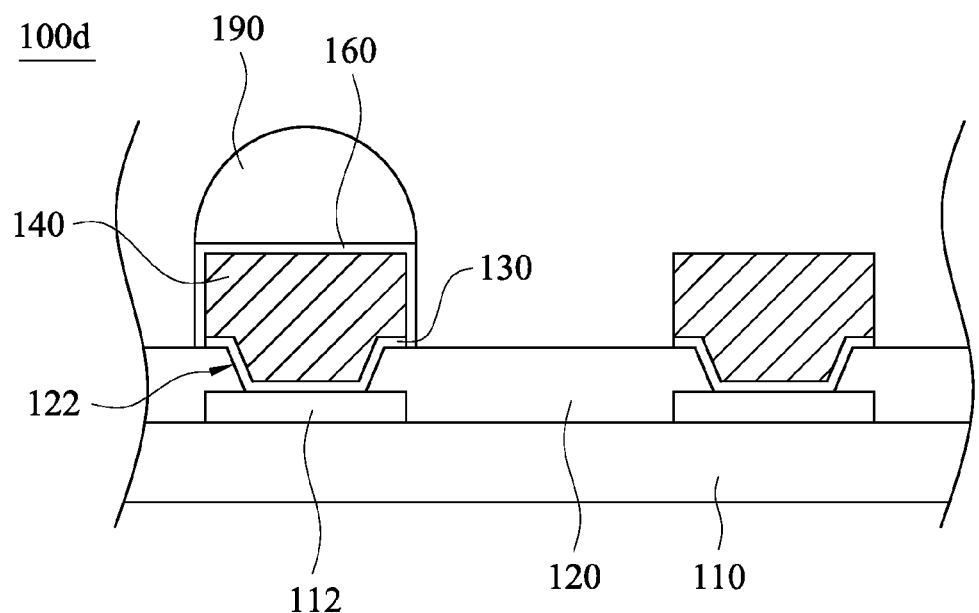
FIG. 15 is a cross-sectional view of a passive component structure according to one embodiment of the present invention, in which the position of the cut line is the same that of FIG. 5.

FIG. 15 is a cross-sectional view of a passive component structure 100d according to one embodiment of the present invention, in which the position of the cut line is the same that of FIG. 5. The passive component structure 100d includes the substrate 110, the protection layer 120, the patterned conductive layer 130, the plural copper bumps 140, and the oxidation barrier layer 160. The different between this embodiment and the embodiment shown in FIG. 5 is that passive component structure 100d does not have the diffusion barrier layer 150 and the strengthening layer 170 shown in FIG. 5, and the oxidation barrier layer 160 is directly located on at least one of the copper bumps 140. The oxidation barrier layer 160 may be made of a material including gold to prevent the copper bump 140 from oxidation. Moreover, the passive component structure 100d further includes the conductive structure 190, such as a solder ball. The conductive structure 190 is electrically connected to the oxidation barrier layer 160.

Figure 16:
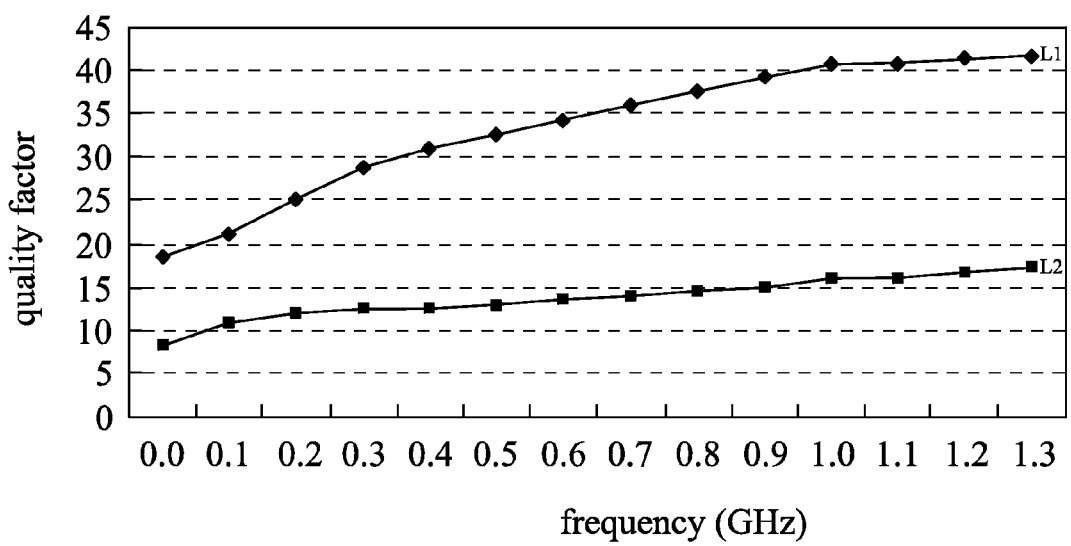
FIG. 16 is a quality factor-frequency relationship chart of a passive component structure according to one embodiment of the present invention and a conventional passive component structure.

FIG. 16 is a quality factor-frequency relationship chart of a passive component structure according to one embodiment of the present invention and a conventional passive component structure. Line L1 is a quality factor-frequency relationship of the passive component structure of the present invention (e.g., the aforesaid passive component structures 100-100d), and metal layers only are formed on some of the copper bumps in the passive component structure of the present invention. Line L2 is a quality factor-frequency relationship of the conventional passive component structure, and metal layers are formed on all of the copper bumps in the conventional passive component structure. As shown in FIG. 16, the inductance quality factor of the passive component structure of the present invention is obviously greater than the inductance quality factor of the conventional passive component structure.

Compared with the present invention and the prior art, the passive component structure and the manufacturing method thereof may form the diffusion barrier layer and the oxidation barrier layer on the selected copper bump, such that the diffusion barrier layer and the oxidation barrier layer are only formed on the copper bump that needs to be electrically connected to a solder ball or a conductive wire in the next manufacturing process (e.g., a BGA process or a wire bonding process), and the diffusion barrier layer and the oxidation barrier layer are not formed on other copper bumps. In addition, the oxidation barrier layer is formed on the copper bump by chemical plating, so that the thickness of the oxidation barrier layer may be smaller than the thickness of a conventional oxidation barrier layer that is formed by electroplating. As a result, the passive component structure and the manufacturing method thereof not only may reduce the material costs of the diffusion barrier layer and the oxidation barrier layer, but also may reduce the entire resistance of the circuits of the passive component structure to improve the efficiency of the passive component structure, such that the inductance quality factor of the passive component structure may be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A passive component structure, comprising:
a substrate having a plurality of bond pads;
a protection layer formed on the substrate and the bond pads and having a plurality of protection layer openings, wherein the positions of the protection layer openings respectively correspond to the positions of the bond pads;
a patterned conductive layer located on the bond pads and surfaces of the protection layer adjacent to the protection layer openings;
a plurality of copper bumps located on the patterned conductive layer;
a diffusion barrier layer being a planar structure and selectively located on the plurality of copper bumps, wherein only a select number of the plurality of copper bumps have the diffusion barrier layer thereon, and remaining number of the plurality of copper bumps have no diffusion barrier layer thereon, and wherein other than in contact with the select number of the plurality of copper bumps, the diffusion barrier layer does not extend to directly contact any layer of same material as the diffusion barrier layer which extends away from the plurality of copper bumps;
an oxidation barrier layer covering the diffusion barrier layer;
a passivation layer over the protection layer and the plurality of copper bumps and having a plurality of passivation layer openings, wherein positions of the plurality of passivation layer openings correspond to positions of the oxidation barrier layer, and the oxidation barrier layer is in the plurality of passivation layer openings; and
a conductive structure located on the oxidation barrier layer that is in the plurality of passivation layer openings, wherein the conductive structure protrudes from the passivation layer, and wherein entire structure of the conductive structure is formed from a same material.

2. The passive component structure of claim 1, further comprising:
a strengthening layer between the diffusion barrier layer and the oxidation barrier layer.

3. The passive component structure of claim 2, wherein the strengthening layer is made of a material comprising palladium.

4. The passive component structure of claim 1, wherein the diffusion barrier layer is made of a material comprising nickel.

5. The passive component structure of claim 1, wherein the oxidation barrier layer is made of a material comprising gold.

6. The passive component structure of claim 1, wherein the thickness of the oxidation barrier layer is in a range from 0.01 µm to 0.1 µm.

7. The passive component structure of claim 1, wherein the conductive structure is electrically connected to the oxidation barrier layer.

8. The passive component structure of claim 1, wherein the conductive structure includes a solder ball or conductive wire.

9. A manufacturing method of a passive component structure, comprising:
(a) providing a substrate having a plurality of bond pads;
(b) forming a protection layer on the substrate and the bonding pads and having a plurality of protection layer openings, wherein the positions of the protection layer openings respectively correspond to the positions of the bond pads;
(c) forming a conductive layer on the bond pads and the protection layer;
(d) forming a patterned photoresist layer on the conductive layer, wherein the conductive layer adjacent to the protection layer openings is exposed through a plurality of photoresist layer openings of the photoresist layer;
(e) respectively electroplating a plurality of copper bumps on the conductive layer that is located in the photoresist layer openings;
(f) removing the photoresist layer and the conductive layer that is not covered by the plurality of copper bumps, thereby forming a patterned conductive layer located on the bond pads and surfaces of the protection layer adjacent to the protection layer openings, wherein the plurality of copper bumps is located on the patterned conductive layer;
(g) forming a passivation layer on the plurality of copper bumps and the protection layer and having a plurality of passivation layer openings, wherein a select number of the plurality of copper bumps are exposed through the plurality of passivation layer openings of the passivation layer; and
(h) chemically plating a diffusion barrier layer and an oxidation barrier layer in sequence selectively on the select number of the plurality of copper bumps that are exposed through the plurality of passivation layer openings, wherein positions of the plurality of passivation layer openings correspond to positions of the oxidation barrier layer, and the oxidation barrier layer is in the plurality of passivation layer openings, wherein the diffusion barrier layer is a planar structure, wherein only the select number of the plurality of copper bumps have the diffusion barrier layer thereon, and remaining number of the plurality of copper bumps have no diffusion barrier layer thereon, wherein other than in contact with the select number of the plurality of copper bumps, the diffusion barrier layer does not extend to directly contact any layer of same material as the diffusion barrier layer which extends away from the plurality of copper bumps,
(i) forming a conductive structure located on the oxidation barrier layer that is in the plurality of passivation layer openings, wherein the conductive structure protrudes from the passivation layer and wherein entire structure of the conductive structure is formed from a same material.

10. The manufacturing method of the passive component structure of claim 9, wherein step (h) further comprises:
chemically plating a strengthening layer on the diffusion barrier layer.

11. The manufacturing method of the passive component structure of claim 9, wherein step (f) further comprises:
etching the conductive layer that is not covered by the plurality of copper bumps to form the patterned conductive layer.

12. The manufacturing method of the passive component structure of claim 9, wherein the passivation layer is made of a material comprising a solder mask.

13. The manufacturing method of the passive component structure of claim 9, wherein the passivation layer is made of a material comprising photoresist, and the manufacturing method of the passive component structure further comprises:
removing the passivation layer.

14. The manufacturing method of the passive component structure of claim 9, wherein step (b) further comprises:
patterning the protection layer, such that the protection layer has the protection layer openings.

15. A passive component structure, comprising:
a substrate having a plurality of bond pads;
a protection layer formed on the substrate and the bond pads and having a plurality of protection layer openings, wherein the positions of the protection layer openings respectively correspond to the positions of the bond pads;
a patterned conductive layer located on the bond pads and surfaces of the protection layer adjacent to the protection layer openings;
a plurality of copper bumps located on the patterned conductive layer;
an oxidation barrier layer being a planar structure and selectively located on the plurality of copper bumps, wherein only a select number of the plurality of copper bumps have the oxidation barrier layer thereon, and remaining number of the plurality of copper bumps have no oxidation barrier layer thereon, and wherein other than in contact with the select number of the plurality of copper bumps, the oxidation barrier layer does not extend to directly contact any layer of same material as the oxidation barrier layer which extends away from the plurality of copper bumps;
a passivation layer over the protection layer and the plurality of copper bumps and having a plurality of passivation layer openings, wherein positions of the plurality of passivation layer openings correspond to positions of the oxidation barrier layer, and the oxidation barrier layer is in the plurality of passivation layer openings; and
a conductive structure located on the oxidation barrier layer, wherein a thickness of the conductive structure is greater than a thickness of the oxidation barrier layer, and an end of the conductive structure facing away from the oxidation barrier layer is free from coverage, wherein entire structure of the conductive structure is formed from a same material.

16. The passive component structure of claim 15, wherein the oxidation barrier layer is made of a material comprising gold.

17. The passive component structure of claim 15, wherein the conductive structure is electrically connected to the oxidation barrier layer.

18. The passive component structure of claim 15, wherein the conductive structure includes a solder ball.

19. A manufacturing method of a passive component structure, comprising:
providing a substrate having a plurality of bond pads;

forming a protection layer on the substrate and the bond pad and having a plurality of protection layer openings, wherein the positions of the protection layer openings respectively correspond to the positions of the bond pads;

forming a conductive layer on the bond pads and the protection layer;

forming a patterned photoresist layer on the conductive layer, wherein the conductive layer adjacent to the protection layer openings is exposed through a plurality of photoresist layer openings of the photoresist layer;

respectively electroplating a plurality of copper bumps on the conductive layer that is located in the photoresist layer openings;

removing the photoresist layer and the conductive layer that is not covered by the plurality of copper bumps, thereby forming a patterned conductive layer located on the bond pads and surfaces of the protection layer adjacent to the protection layer openings, wherein the plurality of copper bumps are located on the patterned conductive layer; and chemically plating an oxidation barrier layer on a select number of the plurality of copper bumps, wherein the oxidation barrier layer is a planar structure and selectively located on the plurality of copper bumps, wherein only the select number of the plurality of copper bumps have the oxidation barrier layer thereon, and remaining number of the plurality of copper bumps have no oxidation barrier layer thereon, and wherein other than in contact with the select number of the plurality of copper bumps, the oxidation barrier layer does not extend to directly contact any layer of same material as the oxidation barrier layer which extends away from the plurality of copper bumps;

forming a passivation layer over the protection layer and the plurality of copper bumps and having a plurality of passivation layer openings, wherein positions of the plurality of passivation layer openings correspond to positions of the oxidation barrier layer, and the oxidation barrier layer is in the plurality of passivation layer openings; and forming a conductive structure on the oxidation barrier layer, wherein an end of the conductive structure facing away from the oxidation barrier layer is free from coverage, wherein entire structure of the conductive structure is formed from a same material.

* * * * *